(12) United States Patent
Eguchi

(10) Patent No.: US 9,377,817 B2
(45) Date of Patent: Jun. 28, 2016

(54) DISPLAY DEVICE

(71) Applicant: Semiconductor Energy Laboratory Co., Ltd., Atsugi-shi, Kanagawa-ken (JP)

(72) Inventor: Shingo Eguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 55 days.

(21) Appl. No.: 14/461,950

(22) Filed: Aug. 18, 2014

(65) Prior Publication Data

US 2015/0055286 A1  Feb. 26, 2015

(30) Foreign Application Priority Data

Aug. 20, 2013  (JP) .................................. 2013-170208

(51) Int. Cl.
| | |
|---|---|
| G06F 1/16 | (2006.01) |
| G02F 1/1333 | (2006.01) |
| G06F 3/044 | (2006.01) |
| G06F 3/0488 | (2013.01) |
| H01L 27/12 | (2006.01) |

(52) U.S. Cl.
CPC ............ *G06F 1/1652* (2013.01); *G02F 1/1333* (2013.01); *G06F 1/1641* (2013.01); *G06F 1/1643* (2013.01); *G06F 1/1647* (2013.01); *G06F 3/044* (2013.01); *G06F 3/04886* (2013.01); *H01L 27/1214* (2013.01)

(58) Field of Classification Search
USPC ............. 345/204, 8, 633, 589, 156, 419, 501, 345/211, 111, 108, 87, 88, 175, 1.2; 361/646, 749, 679.27, 679.02, 679.32, 361/679.08, 679.09, 679.52, 679.26, 361/679.47, 679.54, 679.31, 679.01, 361/679.33, 679.55; 455/573, 572, 99, 345, 455/457, 307, 575.8, 575.7, 575.4, 556.2, 455/575.1; 349/65, 67, 61, 58, 187, 70, 349/158, 149, 151, 73, 139; 362/237, 267, 362/235, 294, 187, 373, 218, 191, 206, 362/249.01, 249.16; 248/454, 455, 459, 248/174, 152
See application file for complete search history.

(56) References Cited

U.S. PATENT DOCUMENTS

| | | | |
|---|---|---|---|
| 2002/0054030 A1 | 5/2002 | Murphy | |
| 2003/0047659 A1* | 3/2003 | Evans | A47G 1/141 248/459 |
| 2012/0217516 A1 | 8/2012 | Hatano et al. | |

(Continued)

FOREIGN PATENT DOCUMENTS

JP  2012-190794 A  10/2012

*Primary Examiner* — Hung Duong
(74) *Attorney, Agent, or Firm* — Robinson Intellectual Property Law Office; Eric J. Robinson

(57) ABSTRACT

A display device includes a display panel, a member, a first fixing portion, a second fixing portion, and a roll-up portion. The display device has a function that enables selection between a first state in which an image is displayed with the display panel not folded and a second state in which an image is displayed with the display panel folded. The display panel is fixed to the first fixing portion and the second fixing portion. One end of the member is fixed to the first fixing portion. The other end of the member is connected to the roll-up portion. The roll-up portion has a function that enables rolling up of the member from the other end of the member. The display panel is folded by rolling up the member. The display panel is unfolded by pulling out the rolled-up member from the roll-up portion.

24 Claims, 13 Drawing Sheets

(56) References Cited

U.S. PATENT DOCUMENTS

| | | | |
|---|---|---|---|
| 2014/0029171 A1* | 1/2014 | Lee | H05K 7/16 361/679.01 |
| 2014/0098075 A1* | 4/2014 | Kwak | G06F 3/0487 345/204 |
| 2014/0321074 A1 | 10/2014 | Chida et al. | |
| 2015/0016126 A1 | 1/2015 | Hirakata et al. | |
| 2015/0028328 A1 | 1/2015 | Ikeda et al. | |
| 2015/0049428 A1* | 2/2015 | Lee | G06F 1/1641 361/679.27 |
| 2015/0062927 A1 | 3/2015 | Hirakata et al. | |
| 2015/0146387 A1* | 5/2015 | Lee | G06F 1/1652 361/749 |
| 2015/0313004 A1* | 10/2015 | Namkung | H05K 1/028 361/749 |

* cited by examiner

DISPLAY DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a lighting device, a power storage device, a driving method thereof, or a manufacturing method thereof.

2. Description of the Related Art

Portable display devices are under active development.

For example, portable display devices are often used outdoors, and force might be accidentally applied by dropping to the display devices. As an example of a display device that is not easily broken, a display device having high adhesiveness between a structure body by which a light-emitting layer is divided and a second electrode layer is known (Patent Document 1).

REFERENCE

Patent Document

[Patent Document 1] Japanese Published Patent Application No. 2012-190794

SUMMARY OF THE INVENTION

An object of one embodiment of the present invention is to provide a foldable display device. Another object is to provide a display device which can be developed. Another object is to provide a novel display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of a display device of the present invention includes a display panel, a member, a first fixing portion, a second fixing portion, and a roll-up portion. The display device has a function that enables selection between a first state in which an image is displayed with the display panel not folded and a second state in which an image is displayed with the display panel folded. The display panel is fixed to the first fixing portion and the second fixing portion. One end of the member is fixed to the first fixing portion. The other end of the member is connected to the roll-up portion. The roll-up portion has a function that enables rolling up of the member from the other end of the member. The display panel is folded by tolling up the member. The display panel is unfolded by pulling out the rolled-up member from the roll-up portion, The roll-up portion has a function of storing part of the member. The roll-up portion has a function of rolling up (reeling) and storing part of the member.

Another embodiment of the display device of the present invention may have a function that enables selection between a first state in which an image is displayed with the display panel not folded and a second state in which an image is displayed with the display panel tri-folded. Another embodiment of the display device of the present invention may have a function that enables selection between a first state in which an image is displayed with the display panel not folded and a second state in which an image is displayed with the display panel folded once or more.

The display panel may include a pixel using an electroluminescent element. The display panel may function as a touch panel. The display panel may be constituted using a transistor. The transistor may be a transistor including silicon. The transistor may be a transistor including an oxide semiconductor. The oxide semiconductor may be an oxide containing indium, gallium, and zinc.

The member may function as a touch panel. Alternatively, the member may have a function of protecting the display panel. The member may have a sheet shape, a stripe shape, or a linear shape.

According to one embodiment of the present invention, a foldable display device can be provided. In addition, a display device which can be developed can be provided. Furthermore, a quickly-foldable display device can be provided according to one embodiment of the present invention.

DETAILED DESCRIPTION OF THE INVENTION

Figure 1A:
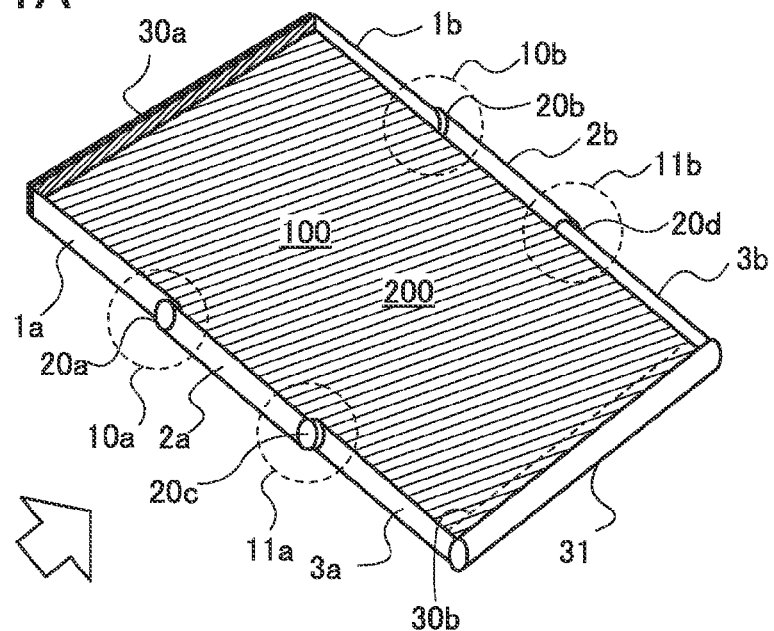
FIGS. 1A to 1C illustrate the structure of a display device according to an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, the structure of a display device of one embodiment of the present invention will be described. The description is made with reference to FIGS. 1A to 1C and FIGS. 2A to 2C.

Figure 1B:
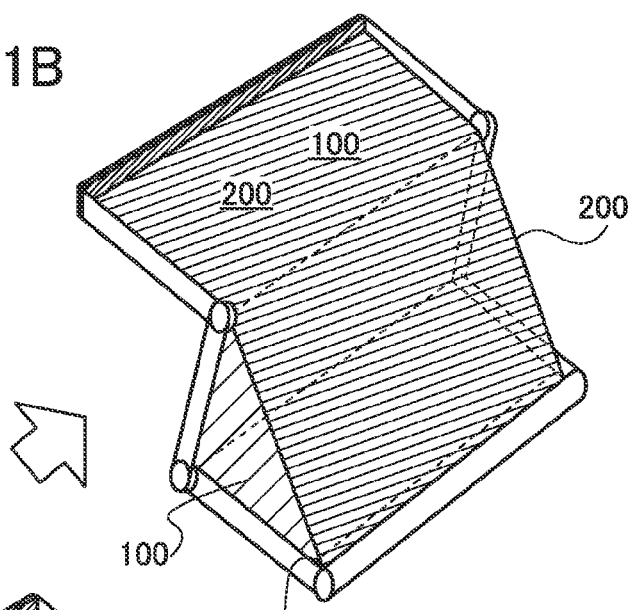
Figure 1C:
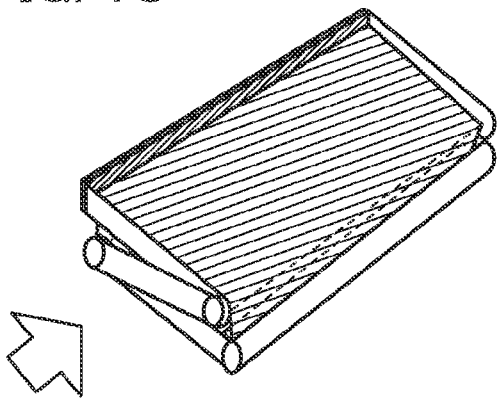
Figure 2A:
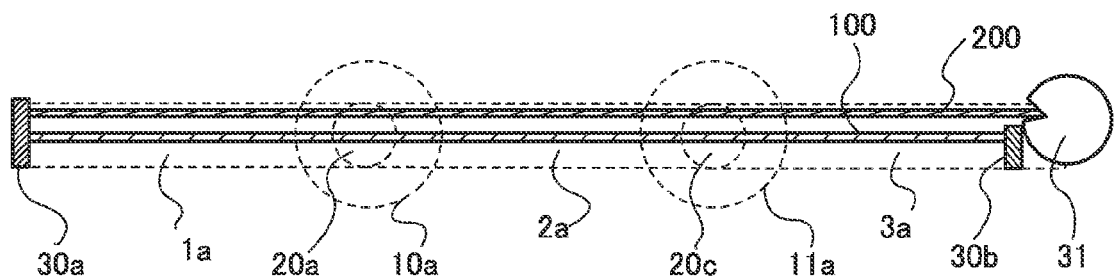
FIGS. 2A to 2C illustrate the structure of a display device according to an embodiment.
Figure 2B:
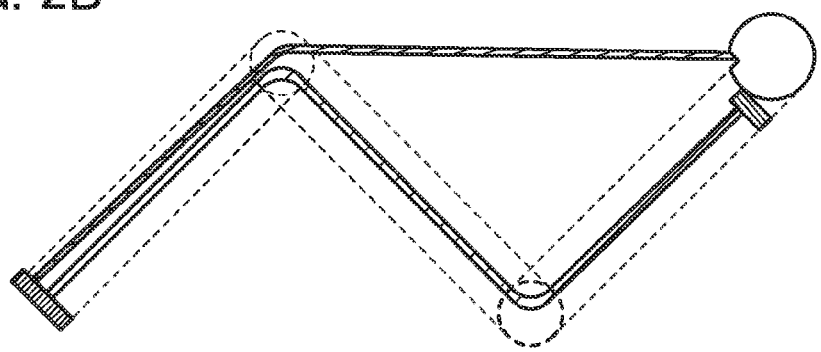
Figure 2C:
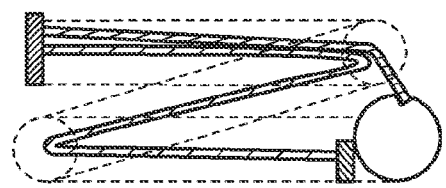

Perspective views of a display device are illustrated in FIGS. 1A to 1C. FIG. 1A illustrates an unfolded state of the display device, FIG. 1C illustrates a tri-folded state thereof and FIG. 1B illustrates a process of folding the display device. Cross-sectional views of the display device are illustrated in FIGS. 2A to 2C. FIG. 2A corresponds to a cross-sectional view viewed from the direction indicated by the white arrow in FIG. 1A, FIG. 2B corresponds to a cross-sectional view viewed from the direction indicated by the white arrow in FIG. 1B, and FIG. 2C corresponds to a cross-sectional view viewed from the direction indicated by the white arrow in FIG. 1C.

In FIG. 1A and FIG. 2A, the display device includes a display panel 100, a member 200, a fixing portion 30a, a fixing portion 30b, and a roll-up portion 31. The display panel 100 is flexible. In addition, the member 200 is also flexible.

In the display panel 100, a first state in which an image or the like is displayed in the state of FIG. 1A and FIG. 2A or a second state in which an image or the like is displayed in the state of FIG. 1C and FIG. 2C can be selected. Note that the display panel 100 may have a function that enables selection between the first state in which an image or the like is displayed in the state of FIG. 1A and FIG. 2A, the second state in which an image or the like is displayed in the state of FIG. 1C and FIG. 2C, and a third state in which an image or the like is displayed in the state of FIG. 1B and FIG. 2B.

In the second state, an image or the like is displayed only in a region of the display panel 100 which is viewable through the member 200 (a one third region) and an image or the like is not displayed in the other regions of the display panel 100. In such a manner, in the second state, display is not performed in a portion of the display panel 100 where display of an image is not necessary (corresponding to a two-thirds region) so that power consumption of the display device can be reduced.

The display device may include a unit for sensing whether or not the display device is in a second state (a folded state). As the sensing unit, for example, a proximity sensor or an optical sensor can be used.

In the case of using the proximity sensor, the second state may be sensed by providing a proximity sensor in a region of an arm or a hinge which is separated from another arm or another hinge in the first state or the third state and which is separated therefrom with a predetermined distance or less in the second state.

In the case of using the optical sensor, the second state may be sensed by providing an optical sensor in a region of the member 200 which is not rolled-up by the roll-up portion 31 in the first state or the third state and which is rolled-up by the roll-up portion 31 in the second state. Whether or not the display device is in the second state can be sensed by existence or strength of light sensed by the optical sensor. Alternatively, the second state may be sensed by providing an optical sensor in a region of an arm or a hinge which is not overlapped with another arm or another hinge in the first state or the third state and which is overlapped therewith in the second state. Whether or not the display device is in the second state can be sensed by existence or strength of light sensed by the optical sensor.

The display panel 100 is fixed to the fixing portion 30a and the fixing portion 30b. One end of the member 200 is fixed to the fixing portion 30a. The other end of the member 200 is connected to the roll-up portion 31. The roll-up portion 31 has a function that enables rolling up of the member 200 from the other end of the member 200. The display panel 100 can have a structure in which the member 200 is rolled-up by the roll-up portion 31 by operations of a button or a handle. The display panel 100 is tri-folded by rolling up the member 200 from the state in FIG. 1A and FIG. 2A to the state in FIG. 1C and FIG. 2C through the state in FIG. 1B and FIG. 2B; accordingly, the display device is folded. The rolled-up member 200 is pulled out from the roll-up portion 31 and the display panel 100 is unfolded from the state in FIG. 1C and FIG. 2C to the state in FIG. 1A and FIG. 2A through the state in FIG. 1B and FIG. 2B; accordingly, the display device is developed. The display device is folded by rolling up the member 200; therefore, the display device can be folded quickly.

Although both the display panel 100 and one end of the member 200 are fixed to the fixing portion 30a in FIGS. 1A to 1C and FIGS. 2A to 2C, one embodiment of the present invention is not limited to such a structure. The display panel 100 and one end of the member 200 may be fixed to different fixing portions.

Furthermore, although the display panel 100 is tri-foldable in FIGS. 1A to 1C and FIGS. 2A to 2C, one embodiment of the present invention is not limited to such a structure. The display device may have a function that enables selection between a first state in which an image is displayed with the display panel not folded and a second state in which an image is displayed with the display panel folded once or more.

Figure 8A:
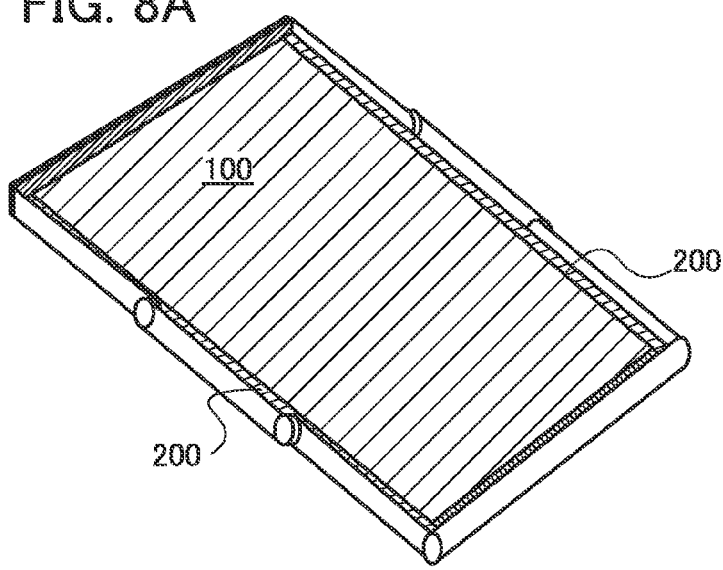
FIGS. 8A to 8C illustrate the structure of a display device according to an embodiment.
Figure 8B:
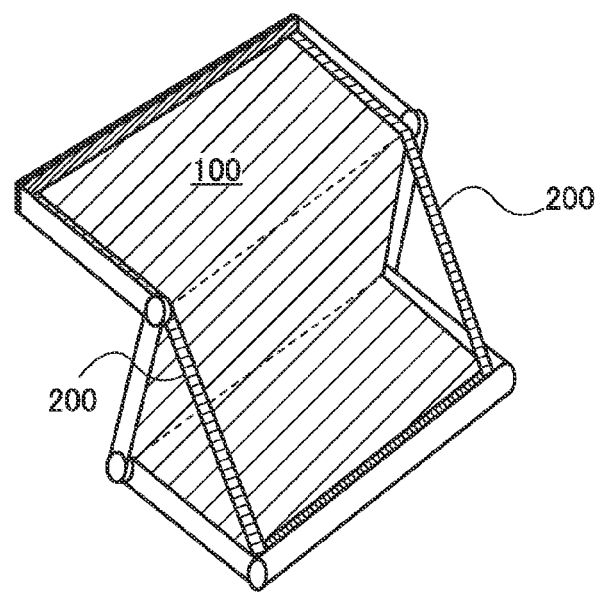
Figure 8C:
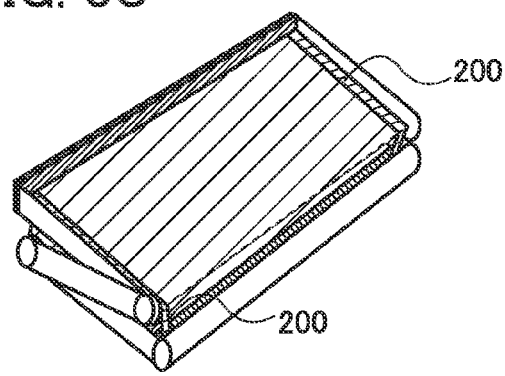

The member 200 may function as a touch panel. Alternatively, the member 200 may have a function of protecting the display panel 100. The member 200 may have a sheet shape as illustrated in FIGS. 1A to 1C and FIGS. 2A to 2C, or a stripe shape or a linear shape as illustrated in FIGS. 8A to 8C. In the case of the member 200 having a stripe shape or a linear shape, the member 200 is preferably disposed so as to be overlapped with a region of the display panel 100 where an image is not displayed. For example, the member 200 is preferably provided so as to be overlapped with a driver circuit provided in the vicinity (hereinafter also referred to as a periphery region of the display panel) of a region of the display panel 100 where pixels are provided (hereinafter also referred to as a pixel portion, a display region, or a display portion).

The display panel 100 may include a pixel using an electroluminescent element. The display panel 100 may function as a touch panel. The display panel 100 may be constituted using a transistor. The transistor may be a transistor including silicon. The transistor may be a transistor including an oxide semiconductor. The oxide semiconductor may be an oxide containing indium, gallium, and zinc.

In FIGS. 1A to 1C and FIGS. 2A to 2C, arms 1a, 1b, 2a, 2b, 3a, and 3b and bending portions 10a, 10b, 11a, and 11b are provided as members that assist folding of the display panel 100. The bending portion 10a includes a hinge 20a. The bending portion 10b includes a hinge 20b. The bending portion 11a includes a hinge 20c. The bending portion 11b includes a hinge 20d.

Here, each hinge can be a member that enables connection between two arms and rotation of both the arms in a plane including major-axis directions of the arms.

One end of the arm 1a is connected to the fixing portion 30a and the other end thereof is connected to the bending portion 10a. One end of the arm 2a is connected to the bending portion 10a and the other end thereof is connected to the bending portion 11a. One end of the arm 3a is connected to the bending portion 11a and the other end thereof is connected to the fixing portion 30b. One end of the arm 1b is connected to the fixing portion 30a and the other end thereof is connected to the bending portion 10b. One end of the arm 2b is connected to the bending portion 10b and the other end thereof is connected to the bending portion 11b. One end of the arm 3b is connected to the bending portion 11b and the other end thereof is connected to the fixing portion 30b.

A structure including the arm 1a, the bending portion 10a, the arm 2a, the bending portion 11a, and the arm 3a is provided along a first side of the display panel 100. A structure including the arm 1b, the bending portion 10b, the arm 2b, the bending portion 11b, and the arm 3b is provided along a second side of the display panel 100. The first side and the second side face each other. In other words, the display panel 100 is sandwiched between the structure including the arm 1a, the bending portion 10a, the arm 2a, the bending portion 11a, and the arm 3a and the structure including the arm 1b, the bending portion 10b, the arm 2b, the bending portion 11b, and the arm 3b. The lengths of the arms 1a and 1b in a major-axis direction are substantially the same, the lengths of the arms 2a and 2b in a major-axis direction are substantially the same, and the lengths of the arms 3a and 3b in a major-axis direction are substantially the same. The bending portions 10a and 10b are provided at a position facing each other with the display panel 100 sandwiched therebetween, and the bending portions 11a and 11b are provided at a position facing each other with the display panel 100 sandwiched therebetween. The hinges 20a and 20b are provided at a position facing each other with the display panel 100 sandwiched therebetween, and the hinges 20c and 20d are provided at a position facing each other with the display panel 100 sandwiched therebetween.

Note that the shapes of the arms 1a, 1b, 2a, 2b, 3a, and 3b are not limited to those illustrated in FIGS. 1A to 1C and FIGS. 2A to 2C. The arms may have an elongated and flat shape, a stick shape, or a cylindrical shape. Part of the arms may have a frame shape or a curved shape. In the case where part of the arms have a frame shape or a curved shape, it is preferable that a region other than the peripheries of the bending portions have a frame shape or a curved shape so as not to disturb the movement of the bending portions. Accordingly, the periphery region of the display panel 100 can be protected, shielded from light, or blocked from impurities such as water or dust. Alternatively, arms facing each other may be connected to each other below the display panel 100. Note that the arms facing each other in a region other than the peripheries of the bending portions are connected to each other so as not to disturb the movement of the bending portions. The back of the display panel 100 can be protected, shielded from light, or blocked from impurities such as water or dust by connecting to each other the arms facing each other.

The hinges 20a and 20b which are provided at a position at which the display panel 100 is folded so as to be convex upward may have a function of preventing the display panel 100 from being folded in a reverse direction. That is, the hinges 20a and 20b may have a function of preventing the display panel 100 from being folded so as to be convex downward. The hinges 20c and 20d which are provided at a position at which the display panel 100 is folded so as to be convex downward may have a function of preventing the display panel 100 from being folded so as to be convex upward. For example, the hinge 20a may function so that the arm 1a rotates on the hinge 20a only in a left direction (counterclockwise) from the state in FIG. 2A. The hinge 20b can also have a similar function. The hinge 20c may function so that the arm 3a rotates on the hinge 20c only in a left direction (counterclockwise) from the state in FIG. 2A. The hinge 20d can also have a similar function. Even when the flexible display panel 100 is used by thus controlling part of rotation of the hinge, the shape of the display panel 100 in a developed state (FIG. 1A and FIG. 2A) can be stabilized.

Figure 7A:
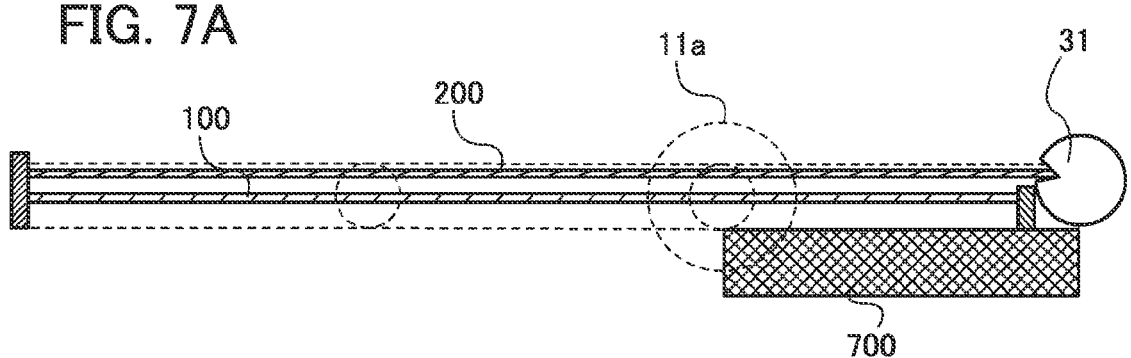
FIGS. 7A to 7C illustrate the structure of a display device according to an embodiment.
Figure 7B:
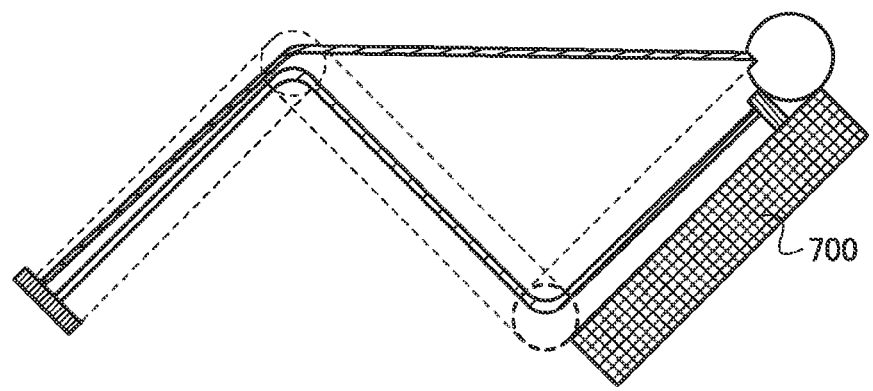
Figure 7C:
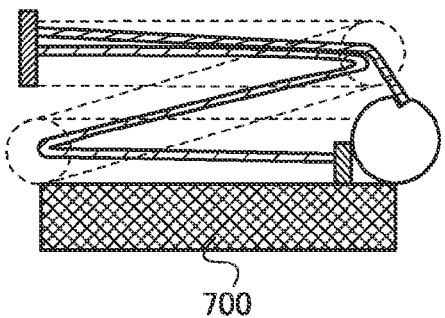

Note that the display device may include a control circuit for outputting a signal to the display panel 100 or the like, a power storage device, a memory, or the like. For example, the display device may include a control circuit 700 as illustrated in FIGS. 7A to 7C. The control circuit 700 can be electrically connected to the display panel 100 through an FPC or the like. The control circuit 700 is provided on the back of the display panel 100 so as not to disturb display of an image. Furthermore, the control circuit 700 is disposed in a region between the roll-up portion 31 and the bending portions 11a and 11b which are closest to the roll-up portion 31 so as not to disturb folding of the display panel 100.

As described above, according to one embodiment of the present invention, a foldable display device can be provided. In addition, a display device which can be developed can be provided. Furthermore, a quickly-foldable display device can be provided.

This embodiment can be combined as appropriate with any of the other embodiments in this specification.

Embodiment 2

In this embodiment, one embodiment of a member that assists folding of the display panel 100 will be described. The description is made with reference to FIGS. 3A to 3D and FIGS. 4A and 4B. In FIGS. 3A to 3D and FIGS. 4A and 4B, description of portions that are similar to those in FIGS. 1A to 1C and FIGS. 2A to 2C is omitted.

In order to assist folding of the display panel 100, the arm or the hinge can be provided with a structure having a function of supporting the display panel 100 (hereinafter also referred to as a support portion). For example, the support portion can serve as a protrusion in contact with the display panel 100. The protrusion can have a cylindrical shape. The support portion can have a circular outer edge and is capable of rotating on the center of the circle serving as an axis. The support portion is capable of rotating on an axis in the direction vertical to the cross section of the display panel 100 at the time of folding of the display panel 100.

Figure 3A:
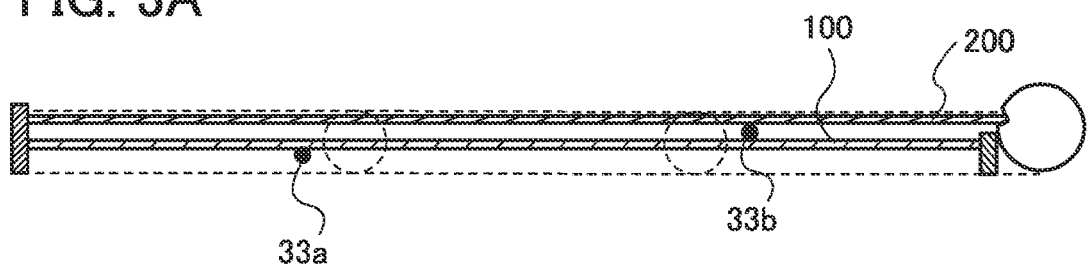
FIGS. 3A to 3D illustrate the structure of a display device according to an embodiment.

FIG. 3A is an example in which a support portion 33a is provided on the arm 1a and a support portion 33b is provided on the arm 3a to assist folding of the display panel 100 in FIG. 2A. Note that in practice, a support portion is similarly provided on the arm sides facing each other. That is, support portions are provided on the arms 1b and 3b.

Figure 3B:
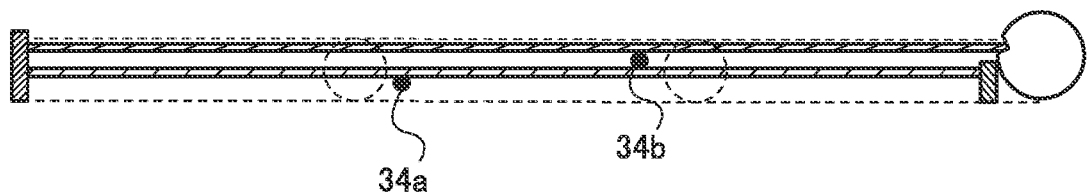

In FIG. 3A, the support, portion 33a is provided below the display panel 100 in a periphery of a region where the display panel 100 is folded so as to be convex upward. The support portion 33b is provided over the display panel 100 in a periphery of a region where the display panel 100 is folded so as to be convex downward. By thus providing the support portions, the folding of the display panel 100 can be assisted, Although FIG. 3A is an example in which the support portion 33a is provided on the arm 1a and the support portion 33b is provided on the arm 3a, one embodiment of the present invention is not limited to such an example. For example, as illustrated in FIG. 3B, a support portion 34a and a support portion 34b may be provided on the arm 2a. Note that in practice, support portions are similarly provided on the arm 2b facing to the arm 2a. At least one support portion can be provided for a bending portion. At least one support portion can also be provided for a hinge. Note that the support portion can be provided over the hinge.

Figure 3C:
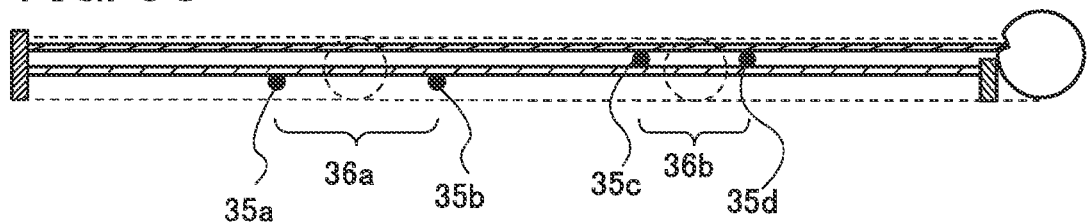

Two support portions can be provided for the bending portion (or the hinge). For example, as illustrated in FIG. 3C, the support portion 35a can be provided on the arm 1a, the support portions 35b and 35c can be provided on the arm 2a, and the support portion 35d can be provided on the arm 3a. Note that in practice, a support portion is similarly provided on the arm sides facing each other. Here, a distance 36a between the two support portions (the support portions 35a and 35b) provided in the vicinity of the bending portion 10a corresponding to a portion where the display panel 100 is folded so as to be convex upward may be different from a distance 36b between the two support portions (the support portions 35c and 35d) provided in the vicinity of the bending portion 11a corresponding to a portion where the display panel 100 is folded so as to be convex downward. In the case of folding the display panel 100, durability of the display panel 100 might be different depending on the structure of the display panel 100 between the case where it is bent so as to be convex upward and the case where it is bent so as to be convex downward. As the curvature radius of the folded portion in the case of folding the display panel 100 gets smaller, the display panel 100 has higher possibility of deterioration or breakage because great force is locally applied thereto. Thus, when the folded portion of the display panel 100 has lower durability, it is preferable that the curvature radius of the folded portion be large. For example, when a defect or the like is likely to be generated in the case where the display panel 100 is folded so as to be convex upward compared to the case where the display panel 100 is folded so as to be convex downward, the distance 36a is preferably made larger than the distance 36b. Accordingly, when the display panel 100 is folded, the curvature radius of the display panel 100 between the support portion 35a and the support portion 35b can be made larger than the curvature radius of the display panel 100 between the support portion 35c and the support portion 35d. Thus, the display device can be folded in a compact way as much as possible while a defect of the display panel 100 is suppressed.

Figure 3D:
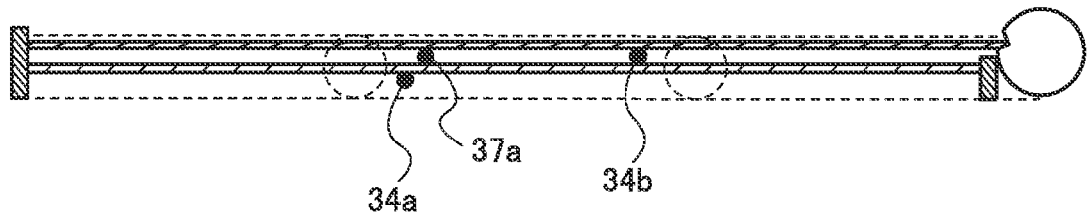

Note that not only the support portion that assists folding of the display panel 100 but also the support portion that suppress friction between the member 200 and the display panel 100 can be provided. For example, in a state where the display panel 100 is not folded, the support portion can be provided between the display panel 100 and the member 200. The support portion can serve as a protrusion. The protrusion can have a cylindrical shape. The support portion can have a circular outer edge and is capable of rotating on the center of the circle serving as an axis. The support portion is capable of rotating on an axis in the direction vertical to the cross section of the display panel 100 at the time of folding of the display panel 100. For example, as illustrated in FIG. 3D, the support portion 34a, the support portion 34b, and a support portion 37a can be provided. Note that in practice, a support portion is similarly provided on the arm sides facing each other. The structure of FIG. 3D corresponds to that of FIG. 3B to which the support portion 37a is added. The support portion 37a has a function of suppressing friction between the member 200 and the display panel 100. The support portion 34b has a function of suppressing friction between the member 200 and the display panel 100 as well as a function of assisting folding of the display panel 100 to be convex downward.

Figure 4A:
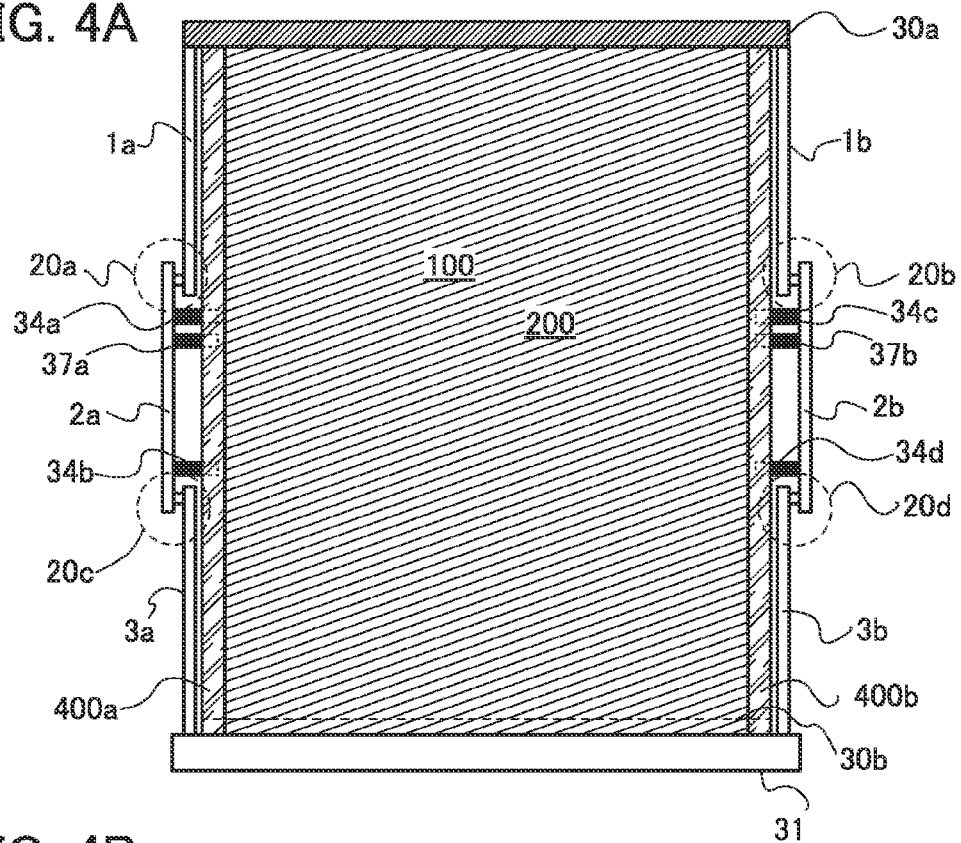
FIGS. 4A and 4B illustrate the structure of a display device according to an embodiment.
Figure 4B:
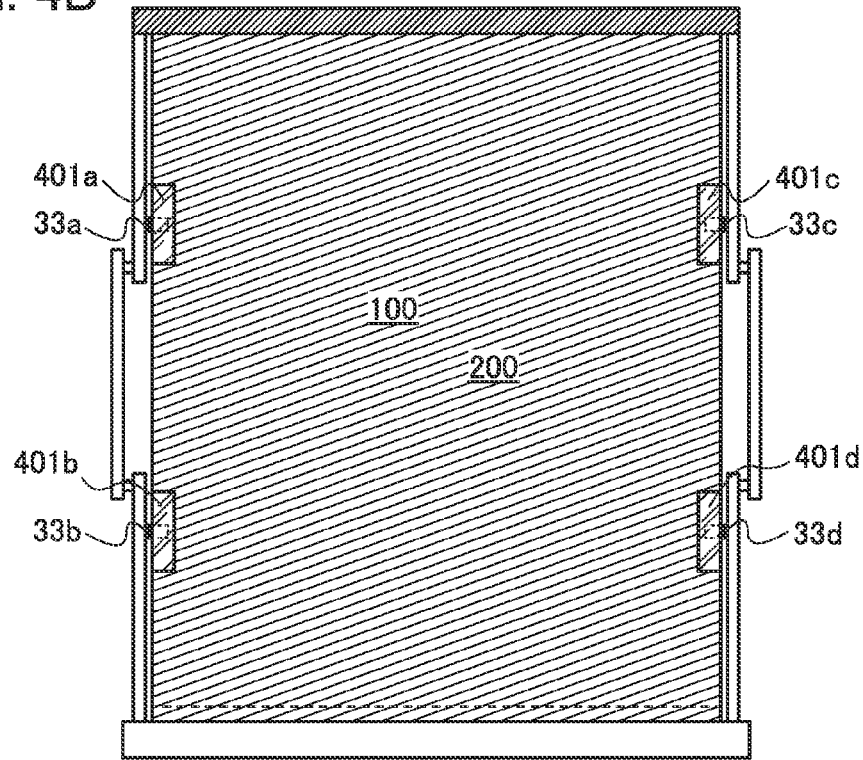

Here, it is preferable that the display panel 100 and the member 200 be provided close to each other as much as possible in the state where the display panel 100 is not folded. It is preferable that the display panel 100 and the member 200 be provided close to each other as much as possible in a region where the display panel 100 and the member 200 are provided substantially parallel to each other (e.g., a region corresponding to the arm 1a in FIGS. 2A to 2C) even in a state where the display panel 100 is folded. In particular, it is preferable that the display panel 100 and the member 200 be preferably provided close to each other as much as possible when the member 200 functions as a touch panel. However, in the case where the support portion is provided between the display panel 100 and the member 200 in the state where the display panel 100 is not folded like in FIG. 3D or the like, a distance between the display panel 100 and the member 200 is lengthened by the length of the support portion. Thus, a region of the member 200 which is in contact with the support portion may be made thinner than another region thereof. FIG. 4A illustrates a top view of a display device corresponding to the display device whose cross-sectional view is illustrated in FIG. 3D. Note that in FIG. 4A, the same portions as those in FIGS. 1A to 1C or FIG. 3D are denoted by the same reference numerals. Note that a support portion 37b faces the support portion 37a. A support portion 34c faces the support portion 34a. A support portion 34d faces the support portion 34b. In a manner in FIG. 4A, in the member 200, a region 400a and a region 400b along two sides which are not connected to the fixing portion 30a or the roll-up portion 31 may be made thinner than another region. For example, the region 400a and the region 400b may be made thinner than another region by thicknesses of the support portions 37a, 37b, 34a, 34b, 34c, and 34d. For example, in a manner similar to that of FIG. 4B which illustrates a top view of a display device corresponding to the display device whose cross-sectional view is illustrated in FIG. 3A, in the member 200, a region 401a, a region 401b, a region 401c, and a region 401d in the vicinities of the support portion 33a, the support portion 33b, a support portion 33c, and a support portion 33d, respectively, can be made thinner than another region. The regions 400a, 400b, 401a, 401b, 401c, and 401d can be provided so as to be overlapped with the periphery region of the display panel 100. Thus, a defect caused by friction between the member 200 and the display panel 100 can be suppressed while the display region (pixel portion) of the display panel 100 and the member 200 is provided close to each other as much as possible.

This embodiment can be combined as appropriate with any of the other embodiments in this specification.

Embodiment 3

In this embodiment, one embodiment of a member that assists folding of the display panel 100 will be described. The description is made with reference to FIGS. 5A to 5D and FIGS. 6A and 6B. In FIGS. 5A to 5D and FIGS. 6A and 6B, description of portions that are similar to those in FIGS. 1A to 1C and FIGS. 2A to 2C is omitted.

Figure 5A:
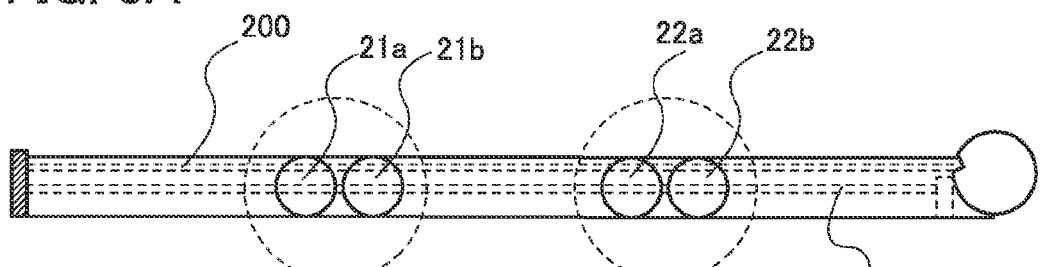
FIGS. 5A to 5D illustrate the structure of a display device according to an embodiment.

Although an example in which a hinge is provided for each bending portion is described in FIGS. 1A to 1C, FIGS. 2A to 2C, and the like, one embodiment of the present invention is not limited to such an example. In each bending portion, a plurality of hinges may be provided. For example, as illustrated in FIG. 5A, two hinges can be provided for each bending portion. In FIG. 5A, a hinge 21a and a hinge 21b are provided for the bending portion 10a, and a hinge 22a and a hinge 22b are provided for the bending portion 11a. For example, as illustrated in FIG. 5C, three hinges can be provided for each bending portion. In FIG. 5C, a hinge 23a, a hinge 23b, and a hinge 23c are provided for the bending portion 10a, and a hinge 24a, a hinge 24b, and a hinge 24c are provided for the bending portion 11a.

Figure 5B:
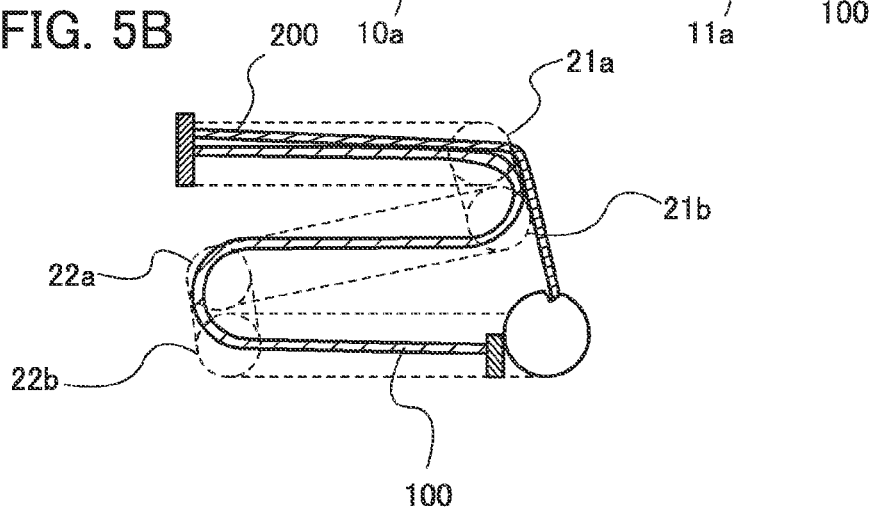
Figure 5C:
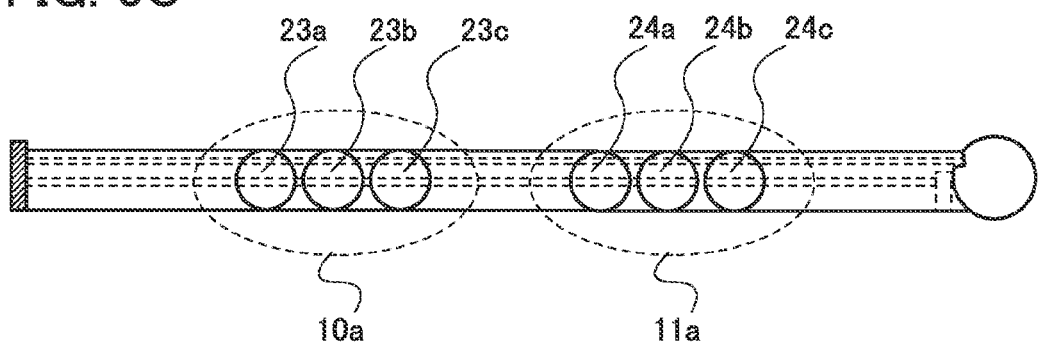
Figure 5D:
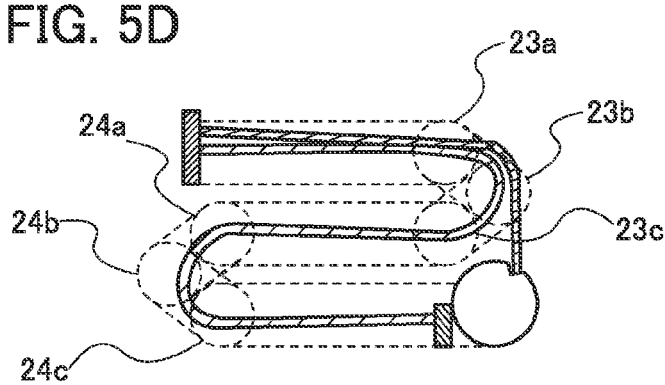
Figure 6A:
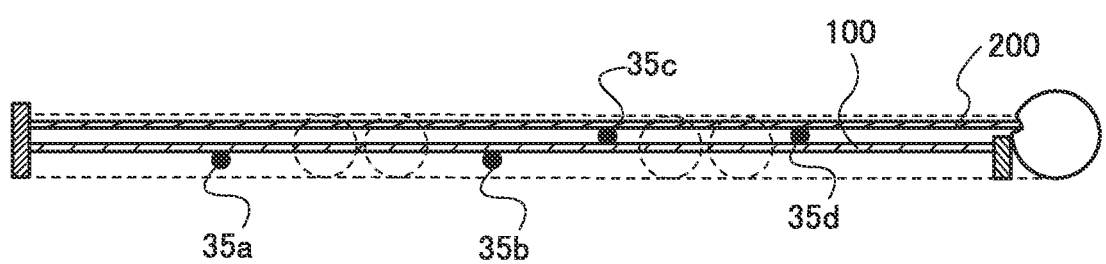
FIGS. 6A and 6B illustrate the structure of a display device according to an embodiment.
Figure 6B:
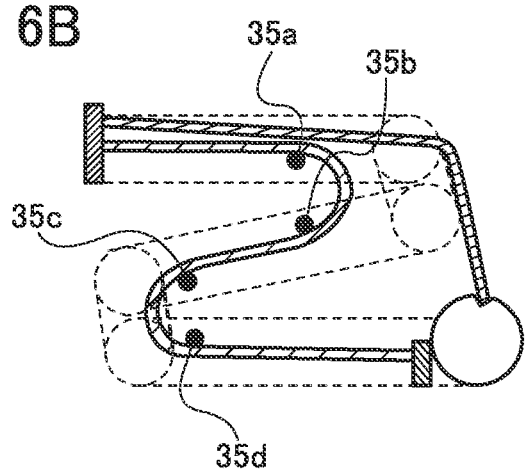

For example, in the case where a plurality of hinges are provided for each bending portion to control a distance between the plurality of hinges, the curvature radius of a folded portion of the display panel 100 can be controlled more easily when the display device is folded as illustrated in FIG. 5B or 5D. Thus, the display device can be folded in a compact way as much as possible while a defect of the display panel 100 is suppressed.

Note that the structure in which a plurality of hinges are provided for each bending portion can be combined with the structure described in Embodiment 2 in which the support portions are provided. The structure of FIGS. 6A and 6B corresponds to that of FIGS. 5A and 5B in which the support portions 35a, 35b, 35c, and 35d are provided. Note that in practice, a support portion is similarly provided on the arm sides facing each other. The distance between the plurality of hinges provided for each bending portion is controlled and further the distance between the support portions provided for each bending portion or each hinge is controlled, whereby the curvature radius of the folded portion of the display panel 100 can be controlled more easily. Thus, the display device can be folded in a compact way as much as possible while a defect of the display panel 100 is suppressed.

This embodiment can be combined as appropriate with any of the other embodiments in this specification.

Embodiment 4

In this embodiment, another structure of the foldable (flexible) display panel 100 that can be used in a display device of one embodiment of the present invention will be described with reference to FIGS. 9A to 9C.

Note that the display panel 100 described in this embodiment includes a light-emitting element and an image sensor, and thus not only can function as a display panel displaying image data but also can be used as a data input unit. Therefore, the display panel 100 is referred to as an input/output device in this embodiment.

Figure 9A:
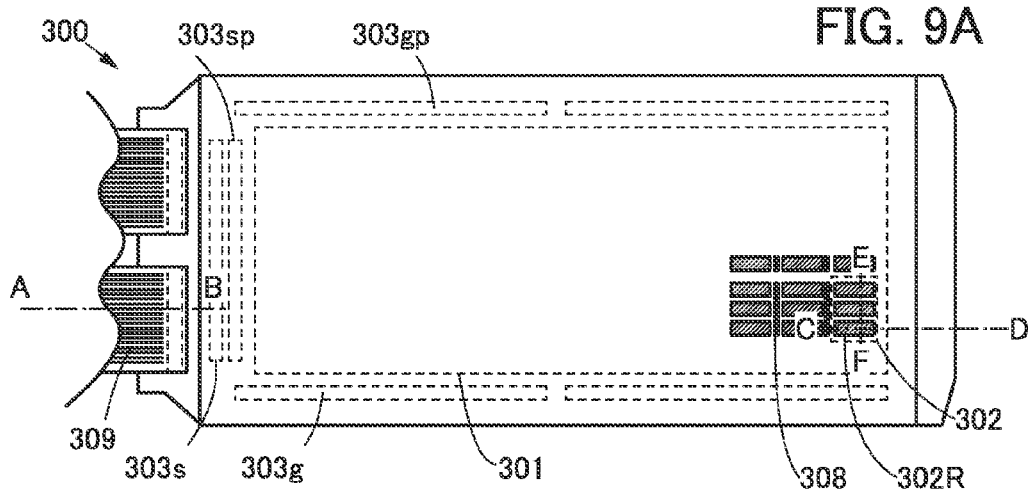
FIGS. 9A to 9C illustrate the structure of an input/output device that can be used for a display device of an embodiment.

FIG. 9A is a top view illustrating the structure of an input/output device that can be used in a display device of one embodiment of the present invention.

Figure 9B:
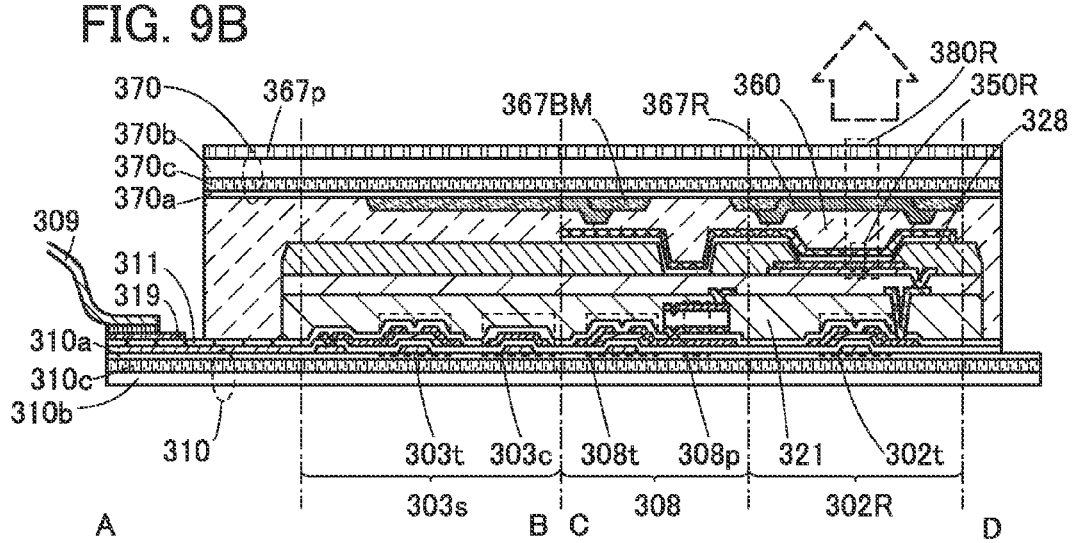

FIG. 9B is a cross-sectional view taken along line A-B and line C-D in FIG. 9A.

Figure 9C:
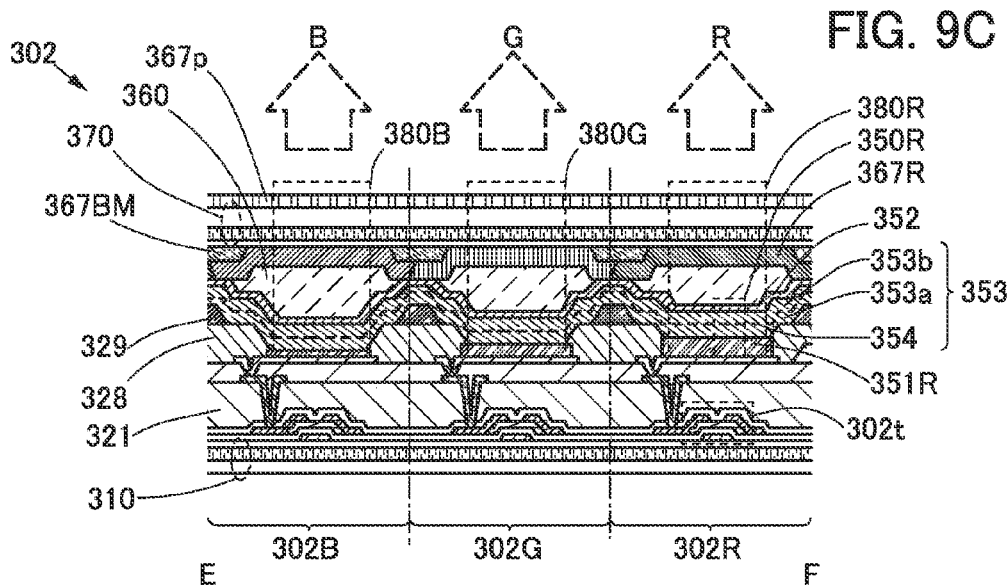

FIG. 9C is a cross-sectional view taken along line E-F in FIG. 9A.

<Top View>

An input/output device 300 described as an example in this embodiment includes a display portion 301 (see FIG. 9A).

The display portion 301 includes a plurality of pixels 302 and a plurality of imaging pixels 308. The imaging pixels 308 can sense a touch of a finger or the like on the display portion 301. With this function, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the input/output device 300 is provided with a scan line driver circuit 303g that can supply selection signals to the pixels 302, and an image signal line driver circuit 303s that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signals include a signal for selecting an imaging pixel circuit from which a recorded imaging signal is read, a signal for initializing an imaging pixel circuit, and a signal for determining the time it takes for an imaging pixel circuit to detect light.

The input/output device 300 is provided with an imaging pixel driver circuit 303gp that can supply control signals to the imaging pixels 308 and an imaging signal line driver circuit 303sp that reads out imaging signals.

<Cross-Sectional View>

The input/output device 300 includes a substrate 310 and a counter substrate 370 that faces the substrate 310 (see FIG. 9B).

The substrate 310 is a stacked body including a flexible substrate 310b, a barrier film 310a that prevents diffusion of unintentional impurities to the light-emitting elements, and an adhesive layer 310c that attaches the barrier film 310a to the substrate 310b.

The counter substrate 370 is a stacked body including a flexible substrate 370b, a barrier film 370a that prevents diffusion of unintentional impurities to the light-emitting elements, and an adhesive layer 370c that attaches the barrier film 370a to the substrate 370b (see FIG. 9B).

A sealant 360 attaches the counter substrate 370 to the substrate 310. The sealant 360 also serving as an optical adhesive layer has a refractive index higher than that of air. The pixel circuits and the light-emitting elements (e.g., a. light-emitting element 350R) are provided between the substrate 310 and the counter substrate 370.

<<Structure of Pixel>>

Each of the pixels 302 includes the sub-pixel 302R, a sub-pixel 302G, and a sub-pixel 302B (see FIG. 9C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit that can supply electric power to the light-emitting element 350R and includes a transistor 302t (see FIG. 9B). Furthermore, the light-emitting module 380R includes the light-emitting element 350R and an optical element (e.g., a coloring layer 367R).

The light-emitting element 350R includes a lower electrode 351R, an upper electrode 352, and a layer 353 containing a light-emitting organic compound between the lower electrode 351R and the upper electrode 352 (see FIG. 9C).

The layer 353 containing a light-emitting organic compound includes a light-emitting unit 353a, a light-emitting unit 353b, and an intermediate layer 354 between the light-emitting units 353a and 353b.

Figure 12:
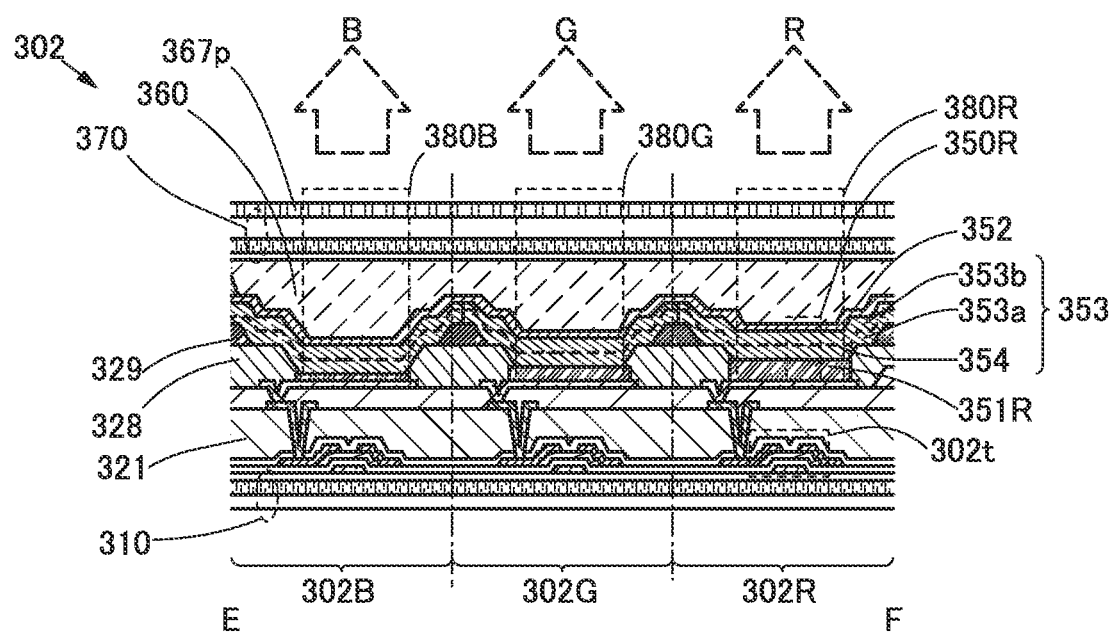
FIG. 12 illustrates the structure of an input/output device that can be used for a display device of an embodiment.

The light-emitting module 380R includes the coloring layer 367R on the counter substrate 370. The coloring layer transmits light of a particular wavelength and is, for example, a layer that selectively transmits light of red, green, or blue color. A region that transmits light emitted from the light-emitting element as it is may be provided as well. For example, as illustrated in FIG. 12, the light-emitting elements of every pixel may emit light of different colors without providing a coloring layer.

The light-emitting module 380R, for example, includes the sealant 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the sealant 360 that also serves as an optical adhesive layer and through the coloring layer 367R and is emitted to the outside of the light-emitting module 380R as indicated by arrows in FIG. 12.

<<Structure of Display Panel>>

The input/output device 300 includes a light-blocking layer 367BM on the counter substrate 370. The light-blocking layer 367BM is provided so as to surround the coloring layer (e.g., the coloring layer 367R).

The input/output device 300 includes an anti-reflective layer 367p positioned in a region overlapping with the display portion 301. As the anti-reflective layer 367p, a circular polarizing plate can be used, for example.

The input/output device 300 includes an insulating film 321. The insulating film 321 covers the transistor 302t. Note that the insulating film 321 can be used as a layer for planarizing unevenness caused by the pixel circuits. An insulating film on which a layer that can suppress diffusion of impurities to the transistor 302t and the like is stacked can be used as the insulating film 321.

The input/output device 300 includes the light-emitting elements (e.g., the light-emitting element 350R) over the insulating film 321.

The input/output device 300 includes, over the insulating film 321, a partition 328 that overlaps with an end portion of the lower electrode 351R (see FIG. 9C). In addition, a spacer 329 that controls the distance between the substrate 310 and the counter substrate 370 is provided on the partition 328.

<<Structure of Image Signal Line Driver Circuit>>

The image signal line driver circuit 303s includes a transistor 303t and a capacitor 303c. Note that the driver circuit can be formed in the same process and over the same substrate as those of the pixel circuits.

<<Structure of Imaging Pixel>>

The imaging pixels 308 each include a photoelectric conversion element 308p and an imaging pixel circuit for sensing light received by the photoelectric conversion element 308p. The imaging pixel circuit includes a transistor 308t.

For example, a PIN photodiode can be used as the photoelectric conversion element 308p.

<<Other Structures>>

The input/output device 300 includes a wiring 311 through which a signal can be supplied. The wiring 311 is provided with a terminal 319. Note that an FPC 309 through which a signal such as an image signal or a synchronization signal can be supplied is electrically connected to the terminal 319.

Note that a printed wiring board (PWB) may be attached to the FPC 309.

This embodiment can be combined as appropriate with any of the other embodiments in this specification.

Embodiment 5

In this embodiment, another structure of the foldable display panel 100 that can be used in a display device of one embodiment of the present invention (also referred to as a flexible display panel 100) is described with reference to FIGS. 10A and 10B and FIG. 11.

Note that the display panel 100 described in this embodiment not only can function as a display panel displaying image data but also can be used as a data input unit. Therefore, the display panel 100 is referred to as a touch panel in this embodiment.

Figure 10A:
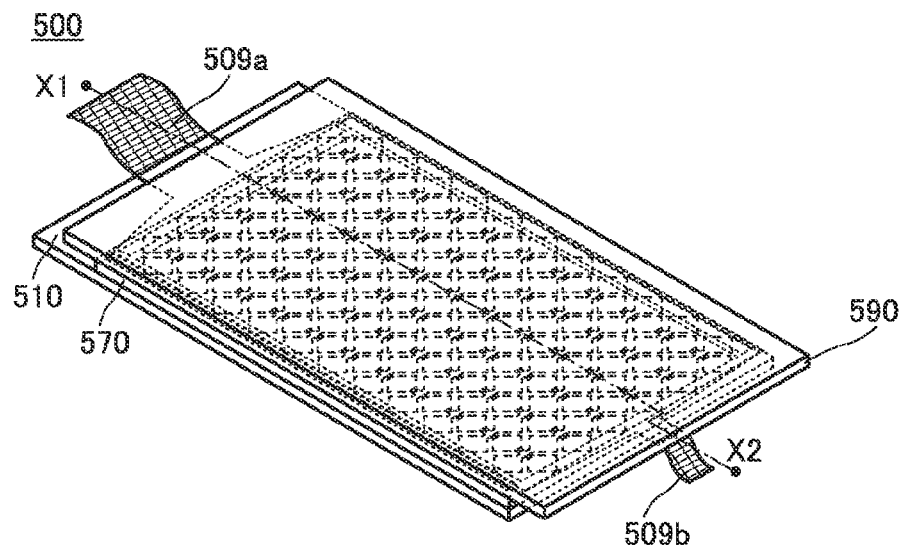
FIGS. 10A and 10B illustrate the structure of an input/output device that can be used for a display device of an embodiment.

FIG. 10A is a perspective view of a touch panel 500 described in this embodiment. Note that FIGS. 10A and 10B illustrate only main components for simplicity. FIG. 10B is a developed view of the perspective view of the touch panel 500.

Figure 11:
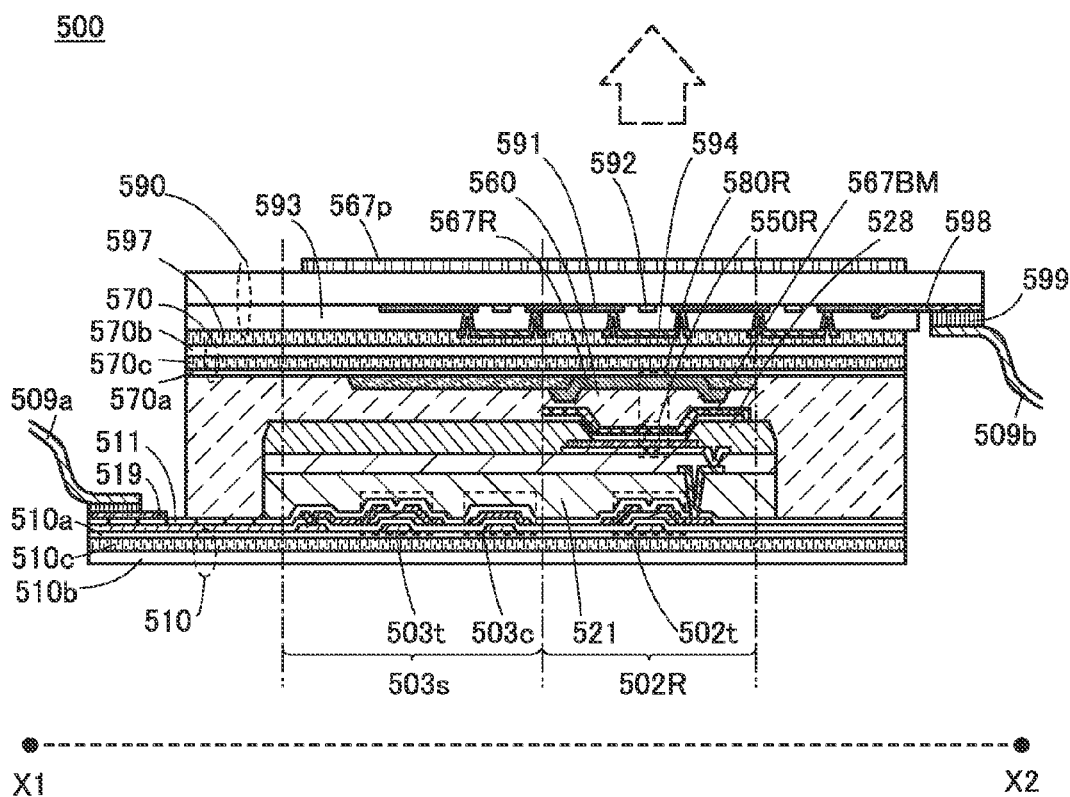
FIG. 11 illustrates the structure of an input/output device that can be used for a display device of an embodiment.

FIG. 11 is a cross-sectional view of the touch panel 500 taken along line X1-X2 in FIG. 10A.

Figure 10B:
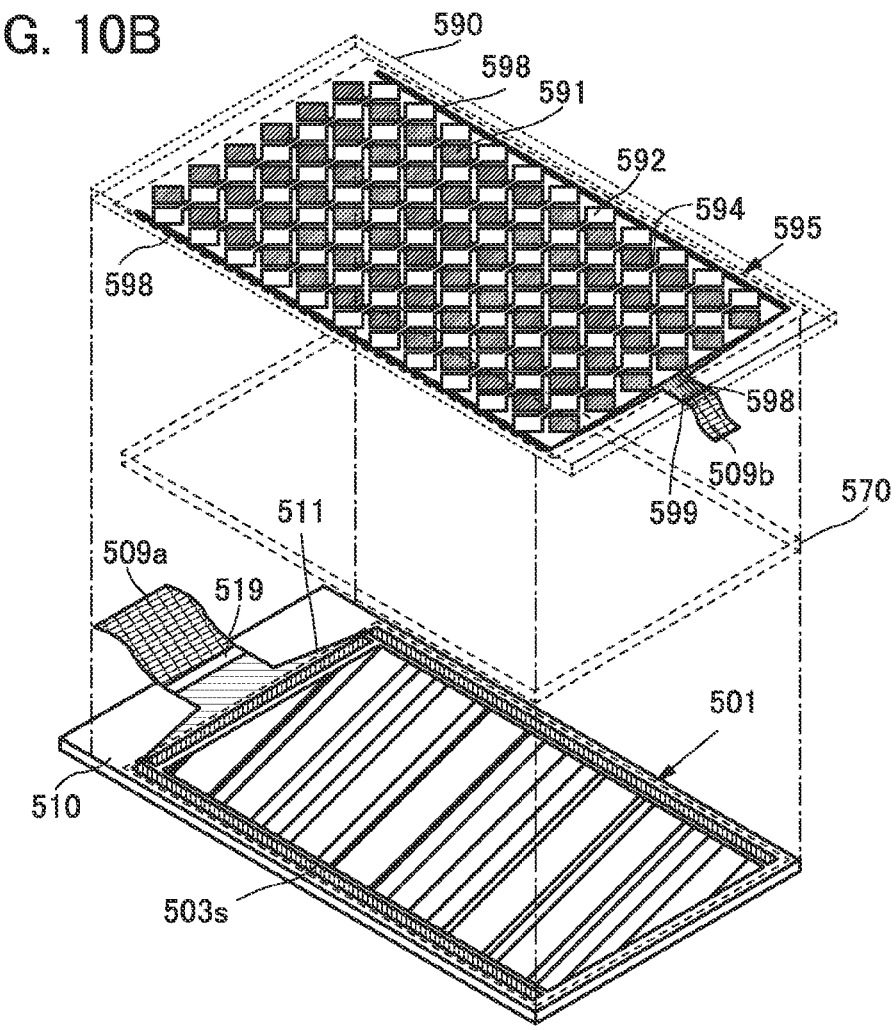

The touch panel 500 includes a display portion 501 and a touch sensor 595 (see FIG. 10B). Furthermore, the touch panel 500 includes a substrate 510, a substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals are supplied to the pixels. The plurality of wirings 511 are led to a peripheral portion of the substrate 510, and part of the plurality of wirings 511 form a terminal 519. The terminal 519 is electrically connected to FPC 509a.

<Touch Sensor>

The substrate 590 includes the touch sensor 595 and a plurality of wirings 598 electrically connected to the touch sensor 595. The plurality of wirings 598 are led to a peripheral portion of the substrate 590, and part of the plurality of wirings 598 form a terminal. The terminal is electrically connected to an FPC 509b. Note that in FIG. 10B, electrodes, wirings, and the like of the touch sensor 595 provided on the back side of the substrate 590 (on the back side of the diagram) are indicated by solid lines for clarity.

As the touch sensor 595, for example, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

An example of using a projected capacitive touch sensor is described below with reference to FIG. 10B.

Note that a variety of sensors that can sense the closeness or the contact of a sensing target such as a finger can be used.

The projected capacitive touch sensor 595 includes first electrodes 591 and second electrodes 592. The first electrodes 591 are electrically connected to any of the plurality of wirings 598, and the second electrodes 592 are electrically connected to any of the other wirings 598.

The second electrodes 592 each have a shape of a plurality of quadrangles arranged in one direction with one corner of a quadrangle connected to one corner of another quadrangle as illustrated in FIGS. 10A and 10B.

The first electrodes 591 each have a quadrangular shape and are arranged in a direction intersecting with the direction in which the second electrodes 592 extend.

A wiring 594 electrically connects two first electrodes 591 between which one of the second electrodes 592 is positioned. The intersecting area of the one of the second electrodes 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the first electrodes 591 and the second electrodes 592 are not limited to the above-mentioned shapes and can be any of a variety of shapes. For example, a plurality of first electrodes each having a stripe shape may be provided so that space between two adjacent first electrodes are reduced as much as possible, and a plurality of second electrodes each having a stripe shape may be provided so as to intersect the first electrodes with an insulating layer sandwiched between the first electrodes and the second electrodes. In that case, two adjacent second electrodes may be spaced apart from each other. Moreover, between the two adjacent second electrodes, it is preferable to provide a dummy electrode which is electrically insulated from these electrodes, whereby the area of a region having a different transmittance can be reduced.

The structure of the touch sensor 595 is described with reference to FIG. 11.

The touch sensor 595 includes the substrate 590, the first electrodes 591 and the second electrodes 592 provided in a staggered arrangement on the substrate 590, an insulating layer 593 covering the first electrodes 591 and the second electrodes 592, and the wiring 594 that electrically connects the adjacent first electrodes 591 to each other.

An adhesive layer 597 attaches the substrate 590 to the substrate 570 as illustrated in FIG. 10B so that the touch sensor 595 overlaps the display portion 501.

The first electrodes 591 and the second electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used.

The first electrodes 591 and the second electrodes 592 may be formed by depositing a light-transmitting conductive material on the substrate 590 by a sputtering method and then removing an unnecessary portion by a variety of patterning technique such as photolithography.

The insulating layer 593 covers the first electrodes 591 and the second electrodes 592. Examples of a material for the insulating layer 593 are a resin such as acrylic or an epoxy resin, a resin having a siloxane bond, and an inorganic insulating material such as silicon oxide, silicon oxynitride, or aluminum oxide.

Furthermore, openings reaching the first electrodes 591 are formed in the insulating layer 593, and the wiring 594 electrically connects the adjacent first electrodes 591. The wiring 594 is preferably formed using a light-transmitting conductive material, in which case the aperture ratio of the touch panel can be increased. Moreover, the wiring 594 is preferably formed using a material that has higher conductivity than the first electrodes 591 and the second electrodes 592.

Each of the second electrodes 592 extends in one direction, and the second electrodes 592 are provided in the form of stripes.

The wiring 594 intersects with one of the second electrodes 592.

Adjacent first electrodes 591 are provided with one of the second electrodes 592 provided therebetween and are electrically connected by the wiring 594.

Note that the first electrodes 591 are not necessarily arranged in the direction orthogonal to the one of the second electrodes 592.

The wirings 598 are electrically connected to the first electrodes 591 and the second electrodes 592. Part of the wirings 598 serves as a terminal For the wirings 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer covering the insulating layer 593 and the wiring 594 may be provided to protect the touch sensor 595.

Furthermore, a connection layer 599 electrically connects the wirings 598 to the FPC 509*b*.

As the connection layer 599, any of various anisotropic conductive films (ACF), anisotropic conductive pastes (ACP), or the like can be used.

The adhesive layer 597 has a light-trans(fitting property. For example, a thermosetting resin or an ultraviolet curable resin can be used; specifically, a resin such as an acrylic resin, a urethane resin, an epoxy resin, or a resin having a siloxane bond can be used.

<Display Portion>

The display portion 501 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such an element.

Other than organic electroluminescent elements, for example, any of various display elements such as display elements (electronic ink) that perform display by an electrophoretic method, an electronic liquid powder method, or the like; MEMS shutter display elements; and optical-interference-type MEMS display elements can be used. Note that pixel circuits suitable for employed display elements can be selected from among a variety of structures.

The substrate 510 is a stacked body including a flexible substrate 510*b*, barrier film 510*a* that prevents diffusion of unintentional impurities to light-emitting elements, and an adhesive layer 510*c* that attaches the barrier film 510*a* to the substrate 510*b*.

The substrate 570 is a stacked body including a flexible substrate 570*b*, a barrier film 570*a* that prevents diffusion of unintentional impurities to the light-emitting elements, and an adhesive layer 570*c* that attaches the barrier film 570*a* to the substrate 570*b*.

A sealant 560 attaches the substrate 570 to the substrate 510. The sealant 560 also serving as an optical adhesive layer has a refractive index higher than that of air. The pixel circuits and the light-emitting elements (e.g., a light-emitting element 550R) are provided between the substrate 510 and the substrate 570.

<<Structure of Pixel>>

A pixel includes a sub-pixel 502R, and the sub-pixel 502R includes a light-emitting module 580R.

The sub-pixel 502R includes the light-emitting element 550R and the pixel circuit that can supply electric power to the light-emitting element 550R and includes a transistor 502*t*. Furthermore, the light-emitting module 580R includes light-emitting element 550R and an optical element a coloring layer 567R).

The light-emitting element 550R includes a lower electrode, an upper electrode, and a layer containing a light-emitting organic compound between the lower electrode and the upper electrode.

The light-emitting module 580R includes the coloring layer 567R on the substrate 570. The coloring layer transmits light of a particular wavelength and is, for example, a layer that selectively transmits light of red, green, or blue color. A region that transmits light emitted from the light-emitting clement as it is may be provided as well.

The light-emitting module 580R, for example, includes the sealant 560 that is in contact with the light-emitting element 550B and the coloring layer 567R.

The coloring layer 567R is positioned in a region overlapping with the light-emitting element 550R. Accordingly, part of light emitted from the light-emitting element 550R passes through the sealant 560 that also serves as an optical adhesive layer and through the coloring layer 567R and is emitted to the outside of the light-emitting module 580R as indicated by arrows in FIG. 11.

<<Structure of Display Portion>>

The display portion 501 includes a light-blocking layer 567BM on the substrate 570. The light-blocking layer 567BM is provided so as to surround the coloring layer (e.g., the coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness caused by the pixel circuits. An insulating film on which a layer that can suppress diffusion of impurities to the transistor 502t and the like is stacked can be used as the insulating film 521.

The display portion 501 includes the light-emitting elements (the light-emitting element 550R) over the insulating film 521.

The display portion 501 includes, over the insulating film 521, a partition 528 that overlaps with an end portion of the lower electrode. In addition, a spacer that controls the distance between the substrate 510 and the substrate 570 is provided on the partition 528.

<<Structure of Image Signal Line Driver Circuit>>

An image signal line driver circuit 503s includes a transistor 503t and a capacitor 503c. Note that the driver circuit can be formed in the same process and over the same substrate as those of the pixel circuits.

<<Other Structures>>

The display portion 501 includes a wiring 511 through which a signal can be supplied. The wiring 511 is provided with a terminal 519. Note that an FPC 509a through which a signal such as an image signal or a synchronization signal can be supplied is electrically connected to the terminal 519.

Note that a printed wiring board (PWB) may be attached to the FPC 509a.

Note that a structure in which the pixel portion does not include a transistor can be employed. That is, a passive-matrix display device can be employed. Alternatively, a lighting device in which a pixel is not provided and light is emitted from the entire surface can be employed.

This embodiment can be combined as appropriate with any of the other embodiments in this specification.

Embodiment 6

In this embodiment, examples of an electronic device that includes a display device of one embodiment of the present invention will be described.

Figure 13A:
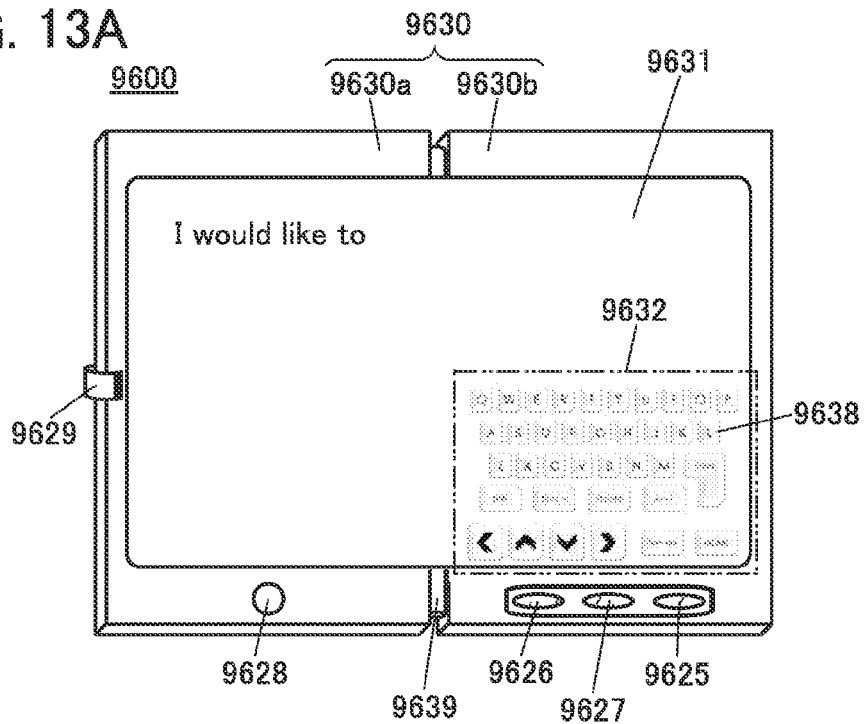
FIGS. 13A to 13C illustrate the structure of an electronic device of an embodiment.
Figure 13B:
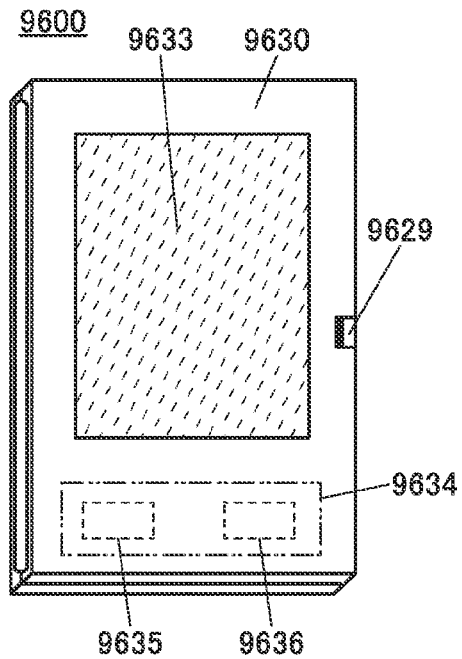

FIGS. 13A and 13B illustrate a foldable tablet terminal 9600. Note that here, an example of the double-foldable tablet terminal is illustrated; however, a display device of one embodiment of the present invention can be employed for those having a large folding number such as a tablet terminal foldable into three or four. In FIG. 13A, the tablet terminal 9600 is opened, and includes a housing 9630, a display portion 9631, a switch 9626 for switching display modes, a power switch 9627, a switch 9625 for switching to power-saving mode, a fastener 9629, and an operation switch 9628.

The housing 9630 includes a housing 9630a and a housing 9630b, and the housing 9630a and the housing 9630b are combined with each other with a hinge portion 9639. The housing 9630 can be double-foldable by virtue of the hinge portion 9639.

With the use of any of the display devices disclosed in this specification and the like as the display portion 9631, the housing 9630a, the housing 9630b, and the hinge portion 9639, the tablet terminal is foldable and can have high reliability.

Part of the display portion 9631 can be a touch panel region 9632 and data can be input when a displayed operation key panel 9638 is touched. Note that for example, half of the display portion 9631 can have only a display function and the other half thereof can have a touch panel function. Alternatively, the whole display portion 9631 may have a touch panel function. For example, keyboard buttons can be displayed on the entire screen of the display portion 9631 so that the entire screen is used as a data input terminal.

The switch 9626 for switching a display mode allows switching between a landscape mode and a portrait mode, color display and black-and-white display, and the like. The switch 9625 for switching to power-saving mode can control display luminance to be optimal in accordance with the amount of external light in use of the tablet terminal which is detected by an optical sensor incorporated in the tablet terminal. In addition to the optical sensor, other detecting devices such as sensors for determining inclination, such as a gyroscope or an acceleration sensor, may be incorporated in the tablet terminal.

In FIG. 13B, the tablet terminal 9600 is closed, and includes the housing 9630, a solar battery 9633, and a charge and discharge control circuit 9634. Note that FIG. 13B illustrates an example in which the charge and discharge control circuit 9634 includes a battery 9635 and a DCDC converter 9636.

With the use of any of the display devices disclosed in this specification and the like, the display portion 9631 can be folded. For example, since the tablet terminal 9600 is double-foldable, the housing 9630 can be closed when the tablet terminal is not used. Thus, the display portion 9631 can be protected by closing the housing 9630, whereby the tablet terminal 9600 can have high durability and portability and thus can have improved reliability for long-term use.

The tablet terminal illustrated in FIGS. 13A and 13B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar cell 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

Figure 13C:
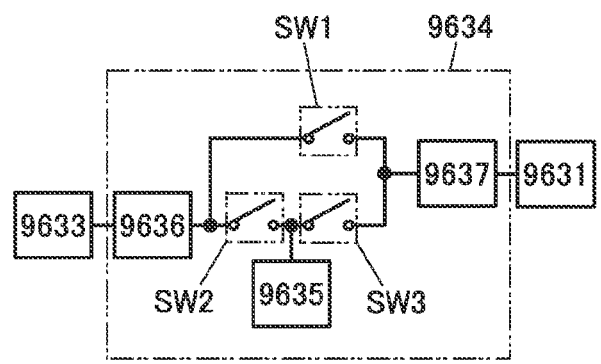

The structure and operation of the charge and discharge control circuit 9634 illustrated in FIG. 13B are described with reference to a block diagram of FIG. 13C. FIG. 13C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 13B.

First, an example of operation in the case where power is generated by the solar battery 9633 using external light is described. The voltage of power generated by the solar cell is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

This embodiment can be combined as appropriate with any of the other embodiments in this specification.

This application is based on Japanese Patent Application serial No. 2013-170208 filed with the Japan Patent Office on Aug. 20, 2013, the entire contents of which are hereby incorporated by reference.

What is claimed is:

1. A display device comprising:
a display panel;
a member over the display panel;
a first fixing portion configured to fix a first end of the display panel and a first end of the member; and
a roll-up portion connected to a second end of the member, wherein the roll-up portion is configured to roll up the member from the second end, and
wherein the display panel reversibly exists in a folded state and an unfolded state.

2. The display device according to claim 1, further comprising a second fixing portion configured to fix a second end of the display panel, wherein the second fixing portion is connected to the roll-up portion.

3. The display device according to claim 1, wherein the display panel is configured to be unfolded by pulling out a rolled-up member from the roll-up portion.

4. The display device according to claim 1, wherein the member has a sheet shape, a stripe shape, or a linear shape.

5. The display device according to claim 1, wherein the member comprises a touch panel.

6. The display device according to claim 1, wherein the member is configured to protect the display panel.

7. The display device according to claim 1, wherein the display panel comprises a pixel including an electroluminescent element.

8. The display device according to claim 1, wherein the display panel comprises a transistor including an oxide semiconductor.

9. A display device comprising:
a display panel;
a member over the display panel;
a first fixing portion configured to fix a first end of the display panel and a first end of the member; and
a roll-up portion connected to a second end of the member, wherein the roll-up portion is configured to roll up the member from the second end so that the display panel is folded into three from an unfolded state.

10. The display device according to claim 9, further comprising a second fixing portion configured to fix a second end of the display panel, wherein the second fixing portion is connected to the roll-up portion.

11. The display device according to claim 9, wherein the display panel is configured to be unfolded by pulling out a rolled-up member from the roll-up portion.

12. The display device according to claim 9, wherein the member has a sheet shape, a stripe shape, or a linear shape.

13. The display device according to claim 9, wherein the member comprises a touch panel.

14. The display device according to claim 9, wherein the member is configured to protect the display panel.

15. The display device according to claim 9, wherein the display panel comprises a pixel including an electroluminescent element.

16. The display device according to claim 9, wherein the display panel comprises a transistor including an oxide semiconductor.

17. A display device comprising:
a display panel;
a member over the display panel;
a first fixing portion configured to fix a first end of the display panel and a first end of the member; and
a roll-up portion connected to a second end of the member, wherein the display panel is configured to display an image on a whole surface of the display panel in an unfolded state and to display an image on part of the display panel in a folded state.

18. The display device according to claim 17, further comprising a second fixing portion configured to fix a second end of the display panel, wherein the second fixing portion is connected to the roll-up portion.

19. The display device according to claim 17, wherein the display panel is configured to be unfolded by pulling out a rolled-up member from the roll-up portion.

20. The display device according to claim 17, wherein the member has a sheet shape, a stripe shape, or a linear shape.

21. The display device according to claim 17, wherein the member comprises a touch panel.

22. The display device according to claim 17, wherein the member is configured to protect the display panel.

23. The display device according to claim 17, wherein the display panel comprises a pixel including an electroluminescent element.

24. The display device according to claim 17, wherein the display panel comprises a transistor including an oxide semiconductor.

* * * * *